United States Patent [19]
Kraft

[11] 4,170,396
[45] Oct. 9, 1979

[54] OPTICAL COMPONENT ELEMENT

[75] Inventor: Heinz-Peter Kraft, Munich, Fed. Rep. of Germany

[73] Assignee: Siemens Aktiengesellschaft, Berlin & Munich, Fed. Rep. of Germany

[21] Appl. No.: 881,025

[22] Filed: Feb. 24, 1978

Related U.S. Application Data

[63] Continuation of Ser. No. 676,465, Apr. 13, 1976, abandoned.

[30] Foreign Application Priority Data

Apr. 14, 1975 [DE] Fed. Rep. of Germany ....... 2516236

[51] Int. Cl.$^2$ ............................. G02B 5/32; G03H 1/30
[52] U.S. Cl. .................... 350/3.70; 350/3.73; 350/3.78
[58] Field of Search ............... 350/3.70–3.73, 350/3.78, 3.75

[56] References Cited

U.S. PATENT DOCUMENTS

| | | | |
|---|---|---|---|
| 3,617,274 | 11/1971 | Lin | 350/3.61 |
| 3,617,702 | 11/1971 | Flournoy | 350/3.73 |
| 3,630,594 | 12/1971 | Gorog | 350/3.71 |
| 3,721,487 | 3/1973 | Pieuchard et al. | 350/3.71 |
| 3,788,726 | 1/1974 | Groh et al. | 350/3.78 |
| 3,807,829 | 4/1974 | Close | 350/3.73 |
| 3,843,225 | 10/1974 | Kock et al. | 350/3.78 |
| 4,021,606 | 5/1977 | Takeda et al. | 350/3.78 |

*Primary Examiner*—Ronald J. Stern
*Attorney, Agent, or Firm*—Hill, Van Santen, Steadman, Chiara & Simpson

[57] ABSTRACT

An optical component element which may be either used as an optical storage medium or as a component in an optical system characterized by a plurality of sub-holograms which will randomly divide a beam of coherent radiation in a plurality of partial beams with each of the sub-holograms producing a single partial beam. Each of the sub-holograms may be constructed so that the partial beam produced thereby exhibits a specific spatial configuration at specific locations in space with the spatial configurations being either focal points, focal lines, circular rings or sectors of a circle. Each of the sub-holograms may have a different area so that the partial beam formed thereby has a varying energy content. Preferably, the sub-holograms are constructed as sectors of a circle.

9 Claims, 1 Drawing Figure

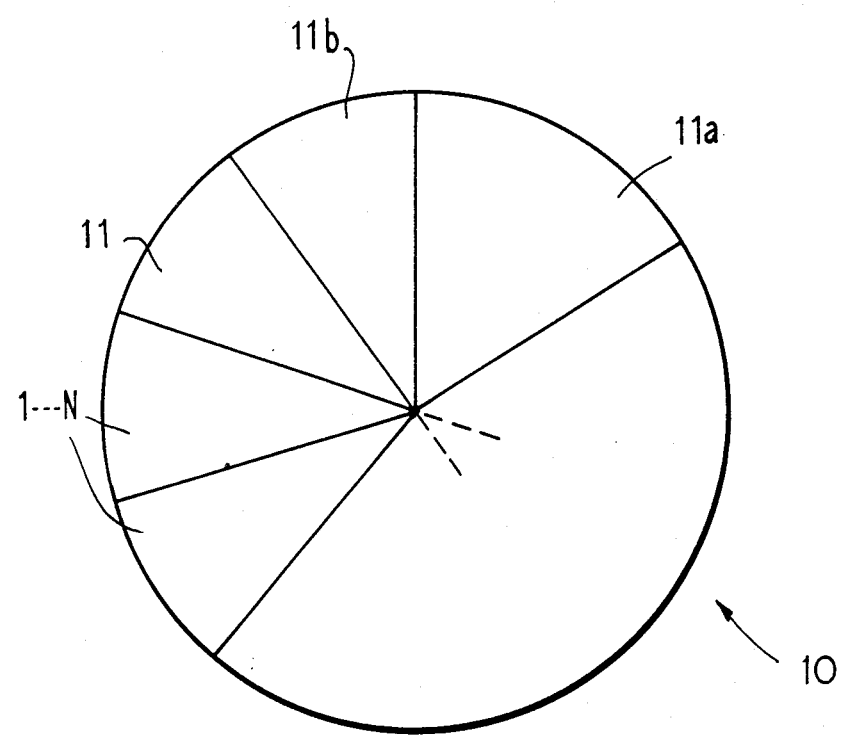

OPTICAL COMPONENT ELEMENT

This is a continuation of application Ser. No. 676,465, filed Apr. 13, 1976, now abandoned.

BACKGROUND OF THE INVENTION

1. Field of the Invention

The present invention is directed to an optical component element for the purpose of creating a random division of a beam of spatially coherent radiation into a plurality of different partial beams. The component may be utilized either as a storage medium in an optical data storage device or as a component in an optical system.

2. Prior Art

In holographic data storage systems, storage elements are known which comprise a hologram carrier with a plurality of sub-holograms which are arranged in a pattern and have a large number of bits of information stored in each sub-hologram. Whether the sub-holograms are incorporated in a parallel or serial fashion, the efficiency of each sub-hologram is dependent on the number of bits of recorded data. For example, the total efficiency during reconstruction decreases with an increase in the number of bits of data so that the diffracted effective energy of a laser beam during reconstruction becomes smaller as the amount of stored bits of data is increased.

SUMMARY OF THE INVENTION

The present invention is directed to an optical component element with the purpose of creating a random division of a single beam of spatially coherent radiation into a plurality of different partial beams with each partial beam being produced having the maximum possible efficiency.

To accomplish these tasks, the component comprises a carrier member and a plurality of different sub-holograms formed thereon, each of the sub-holograms being constructed to produce one of the different partial beams.

The carrier member of the optical component element may be either a photographic plate with the plurality of sub-holograms recorded therein, or a glass plate having a coating of dichromate gelatin with the plurality of sub-holograms formed in the coating of the dichromate gelatin. Each of the sub-holograms is advantageously constructed so that the partial beams produced by each sub-hologram exhibits a specific spatial configuration at specific locations in space. The spatial configuration may be in the form of either a focal point, a focal line, a circular ring, or a sector of a circle.

In the preferred embodiment, each of the sub-holograms may have a different area so that a partial beam formed by each sub-hologram has a different energy content. In a preferred embodiment, each of the sub-holograms is constructed as a sector of a circle and the area of each sector may be different to produce partial beams having different energy content.

The optical component element of the present invention may be used in an optical system for dividing a beam of coherent radiation into a plurality of partial beams. The component may also be used as a multiple hologram in a holographic storage system with each sub-hologram storing only a single piece or bit of picture information so that during retrieval of the information, each sub-hologram reconstructs or produces only a single partial beam. Since each sub-hologram during reconstruction only produces a single partial beam, the multiple hologram or optical component element of the present invention exhibits a great advantage over known storage elements with a pattern of sub-holograms for the reason that each reconstructed partial beam occurs with the maximum possible efficiency which is almost 100%. In addition, the decreased redundancy, as compared with a single hologram plate with a varying number of picture data, is also completely compensated.

DESCRIPTION OF THE DRAWING

The FIGURE illustrates an optical component element in accordance with the present invention.

DESCRIPTION OF THE PREFERRED EMBODIMENT

The principles of the present invention are particularly useful in an optical component element which is generally indicated at 10 in the figure and has a plurality of sub-holograms 11 with each having a shape of a sector of a circle. The component element 10, which is a circular member whose area is filled by the sectors of the sub-holograms 11, may be used as a multiple hologram information storage element or may be used as an element for creating a plurality of partial beams in an optical system.

If the component element 10 is a multi-point hologram in which a picture point is stored in each of the sub-holograms 11, it is produced by means of successive exposures of the sectors of a circle on a photographic plate. A sector of a circle with a sector angle of 360°/N is assigned for each point which is to be recorded on the multi-point hologram 10, wherein N is the number of points to be recorded. To record each of the points, a circular mask with a cut-out sector corresponding to the sector for each of the sub-holograms 11 is located either directly in front or on the photographic plate so that only the portion of the plate corresponding to a single sector is exposed during each step of recording. After exposure of one sub-hologram 11, the mask is rotated or turned by an angle corresponding to the angle of each sector and a subsequent exposure is made. In exposing each of the sub-holograms, a light source comprising a laser in the visible range of radiation may be utilized, and the object wave is preferably formed as a divergent spherical wave with the reference wave being a planar wave. In utilizing this process, a circular multi-point hologram having three, six or ten focal points may be produced. After the exposure of the sub-holograms and a corresponding development and bleaching process is utilized, so that a reconstructed light wave of the recording wavelength will be produced with an efficiency of almost 100%.

In order to achieve as good an efficiency as possible, the hologram is preferably produced as a volume-phase hologram on a photographic plate which has a gelatin layer with a thickness of more than $7\mu$ and for example $15\mu$. In order that only the desired first order of diffraction occurs during reconstruction, it is particularly desirable that the angle between the reference beam and the object beam during recording is as large as possible. In addition, it is desirable that the reference wave as well as the object wave have as uniform an energy distribution as possible over their entire cross section. To obtain a uniform energy distribution, a single laser beam is first expanded and the energy in the direct vicinity of the axis of the beam is partially blocked or filtered in a conventional manner.

The optical component element 10 has been discussed as being used in a data storage system as a storage medium. The component 10 can also be utilized in an optical system other than a data storage system. For example, it may be used in an optical material processing system, which uses a laser for providing heat during soldering or welding. The processing system often requires a plurality of laser beams to perform the soldering or welding at discrete separate points. In such a system, a YAG laser which has a continuous operation is utilized as the energy source. In order not to exceed the allowable thermal stress on the gelatin layer of the optical component 10, the laser beam is expanded before it is projected through the component 10 which divides the beam into a pluality of different partial beams. Each of the plurality of sub-holograms 11 of the component 10 focuses its respective partial beam on a desired point or location which is spaced from the other points or locations. Each point will have a spatial configuration such as a focal point, a linear focal line, a circular ring, or a sector of a circle. The particular spatial configuration will depend on the construction of the sub-holograms 11. According to the particular processing operation which is occuring, the area of the individual sub-holograms 11 of the optical component 10 will vary in size or area so that the partial beams for each of these sub-holograms will vary in their energy content. For example, sub-hologram 11a is larger in area than sub-hologram 11b and the partial beam created by sub-hologram 11a will have a higher energy content than the partial beam created by sub-hologram 11b.

Although various minor modifications may be suggested by those versed in the art, it should be understood that I wish to employ within the scope of the patent granted hereon, all such modifications as reasonably and properly come within the scope of my contribution to the art.

I claim:

1. An optical component element for an optical material processing system, which uses a laser beam to provide heat, said component element being a circular member and dividing a single laser beam of spatially coherent radiation into a plurality of different partial beams, said component element comprising a carrier member, and a plurality of different sub-holograms formed thereon, each of said sub-holograms being a sector of a circle with the sectors filling the area of the circular member, each of said sub-holograms being constructed to produce one of the different partial beams with each partial beam exhibiting a specific spatial configuration at a specific location in space with the location of each partial beam being spaced from the locations of the other partial beams, at least one sub-hologram having a sector with a different area than the other sectors so that as the coherent radiation of the single laser beam is projected through the plurality of sub-holograms a plurality of partial beams are created to apply heat to each of the specific locations with the partial beams associated with said one sub-hologram having a different energy content.

2. An optical component element according to claim 1, wherein said carrier member is a photographic plate with the sub-holograms exposed therein.

3. An optical component element according to claim 1, wherein the carrier member is a glass plate having a coating of dichromate gelatin and wherein the plurality of sub-holograms are formed in the coating of dichromate gelatin.

4. An optical component element according to claim 1, wherein each of the spatial configurations is a focal point.

5. An optical component element according to claim 1, wherein each of the spatial configurations is a focal line.

6. An optical component element according to claim 1, wherein each of the spatial configurations is a circular ring.

7. An optical component element according to claim 1, wherein each of the spatial configurations is a sector of a circle.

8. An optical component element according to claim 1, wherein each of the sectors of the sub-holograms has a different surface area so that the partial beam produced by each of the sub-holograms have different energy contents.

9. A method of optically processing a material by providing heat at specific locations on the material which locations are spaced from each other, said method comprising providing a laser beam and a circular optical component element comprising a carrier member and a plurality of different sub-holograms formed thereon, each of said sub-holograms being a sector of a circle with the sectors filling the area of the circular component element, each of said sub-holograms being constructed to produce a separate partial beam with each partial beam exhibiting a special spatial configuration at a specific location in space with the location of each partial beam being spaced from the location of the other partial beams, at least one sub-hologram having a sector with a different area than the other sectors so that the partial beam associated with said one sub-hologram will have a different energy content than the other partial beams; expanding the laser beam; and projecting the expanded laser beam of spatially coherent radiation through the plurality of sub-holograms to produce the plurality of partial beams to apply heat to each of the specific locations.

* * * * *